(12) United States Patent
Yoda et al.

(10) Patent No.: US 9,822,452 B2
(45) Date of Patent: *Nov. 21, 2017

(54) CONDUCTION STRUCTURE, METHOD OF MANUFACTURING CONDUCTION STRUCTURE, DROPLET EJECTING HEAD, AND PRINTING APPARATUS

(71) Applicant: SEIKO EPSON CORPORATION, Tokyo (JP)

(72) Inventors: Tsuyoshi Yoda, Matsumoto (JP); Hiroshi Sugita, Shiojiri (JP); Ikuya Miyazawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/616,491

(22) Filed: Feb. 6, 2015

(65) Prior Publication Data

US 2015/0224772 A1 Aug. 13, 2015

(30) Foreign Application Priority Data

Feb. 10, 2014 (JP) .................................. 2014-023735

(51) Int. Cl.
*B41J 2/16* (2006.01)
*C23C 18/16* (2006.01)
*B41J 2/14* (2006.01)

(52) U.S. Cl.
CPC ....... *C23C 18/1603* (2013.01); *B41J 2/14233* (2013.01); *B41J 2/161* (2013.01);
(Continued)

(58) Field of Classification Search
CPC ..... C23C 18/1603; C23F 1/02; H05K 1/0298; B41J 2/1626; B41J 2/14201; B41J 2/14072; B41J 2002/14217; B41J 2002/14241; B41J 2002/14258; B41J 2002/14492; B41J 2/1631
(Continued)

(56) References Cited

U.S. PATENT DOCUMENTS 5,754,205 A * 5/1998 Miyata ................ B41J 2/14233
29/25.35
7,326,639 B2 2/2008 Akagawa et al.
(Continued)

FOREIGN PATENT DOCUMENTS

CN 1915668 A 2/2007
JP 2003-086762 A 3/2003
(Continued)

*Primary Examiner* — Sharon A Polk
(74) *Attorney, Agent, or Firm* — Maschoff Brennan

(57) ABSTRACT

A conduction structure includes a device substrate (third substrate) including a conductive portion, an IC (second substrate) including an upper surface, an end surface inclined toward the upper surface, and a conductive portion (second conductive portion), a sealing plate (first substrate) including an upper surface, an end surface (first side wall portion) inclined toward the upper surface, and a conductive portion (first conductive portion), and plating layers that respectively form electrical connections between a conductive portion and a conductive portion and between a conductive portion and the conductive portion.

20 Claims, 10 Drawing Sheets

(52) U.S. Cl.
CPC .......... *B41J 2/1629* (2013.01); *B41J 2/1631* (2013.01); *B41J 2/1643* (2013.01); *B41J 2/1628* (2013.01); *B41J 2002/14491* (2013.01); *Y10T 428/24488* (2015.01)

(58) Field of Classification Search
USPC .......................................... 29/890.1; 347/20
See application file for complete search history.

(56) References Cited

U.S. PATENT DOCUMENTS

| | | |
|---|---|---|
| 7,595,562 B2 | 9/2009 | Mizuno et al. |
| 7,784,913 B2 | 8/2010 | Yoda |
| 2006/0164468 A1* | 7/2006 | Yoda .................... B41J 2/14233 347/71 |
| 2007/0042613 A1 | 2/2007 | Yoda |
| 2012/0326307 A1 | 12/2012 | Jeong et al. |
| 2015/0191012 A1* | 7/2015 | Yoshiike .................... B41J 2/14 347/54 |
| 2015/0230333 A1* | 8/2015 | Yoda ........................ C23F 1/02 174/255 |

FOREIGN PATENT DOCUMENTS

| | | |
|---|---|---|
| JP | 2005-311122 A | 11/2005 |
| JP | 2006-140247 A | 6/2006 |
| JP | 2006-279016 A | 10/2006 |
| JP | 2006-289943 A | 10/2006 |
| JP | 2007-283691 A | 11/2007 |
| JP | 2007-290232 A | 11/2007 |
| JP | 2009-166410 A | 7/2009 |
| JP | 2009-200307 A | 9/2009 |
| JP | 4581664 B2 | 11/2010 |

\* cited by examiner

CONDUCTION STRUCTURE, METHOD OF MANUFACTURING CONDUCTION STRUCTURE, DROPLET EJECTING HEAD, AND PRINTING APPARATUS

BACKGROUND

1. Technical Field

The present invention relates to a conduction structure, a method of manufacturing a conduction structure, a droplet ejecting head, and a printing apparatus.

2. Related Art

A printing apparatus including a droplet ejecting head is used when printing is performed on a recording medium such as printing paper (for example, see JP-A-2006-289943).

The droplet ejecting head disclosed in JP-A-2006-289943 includes a flow channel forming substrate in which a pressure generating chamber that temporarily stores ink and an ejection port that communicates with the pressure generating chamber and ejects ink in the pressure generating chamber as droplets are formed, and a reservoir forming substrate which is provided on the flow channel forming substrate, and in which a portion of a reservoir that preliminarily maintains ink to be supplied to the pressure generating chamber is formed. Also, a piezoelectric element adjacent to the pressure generating chamber is arranged. The piezoelectric element is electrically connected to a driver IC that controls the driving of the piezoelectric element via a wiring pattern (conduction structure). Also, it is possible to securely eject ink droplets from the ejection port by driving the piezoelectric element.

Here, the piezoelectric element is provided in a space called a piezoelectric element maintaining portion provided on the flow channel forming substrate. Also, the wiring pattern connecting the piezoelectric element and the driver IC is constructed along the inclination surface provided on the flow channel forming substrate. The wiring pattern (conduction structure) connecting between the piezoelectric element and the driver IC is formed by various methods. For example, JP-A-2006-289943 employs a method of bonding the reservoir forming substrate and the driver IC while the position of electric wiring constructed on the inclination surface and the mounting surface of the driver IC and positions of connection terminals of the driver IC are matched, and then depositing plating metal on electric wiring on both the reservoir forming substrate side and connection terminals on the driver IC side by an electroless plating method. Then, the electric wiring of the reservoir forming substrate and the connection terminal of the driver IC are electrically bonded by depositing plating metal on both until the both are bonded each other.

Meanwhile, JP-A-2005-311122 and JP-A-2006-140247 disclose a method of arranging the semiconductor device on the wiring substrate and electrically connecting the wiring substrate and the semiconductor device by growing plating metal from both the connection terminal of the wiring substrate and the connection terminal of the semiconductor device by the electroless plating method.

However, in the method disclosed in JP-A-2006-289943, the electric wiring constructed on the mounting surface of the driver IC in the reservoir forming substrate and the connection terminal of the driver IC are maintained in a state of facing each other, and then are subjected to an electroless plating method. Therefore, the method of mounting the driver IC is limited to a so-called face down method. As a result, in the mounting of the driver IC, it is necessary to prepare a flat surface for face down mounting, that is, a surface corresponding to the mounting surface of the driver IC described above. Therefore, it is necessary to secure a wide mounting surface, and thus the line length of the wiring pattern becomes long. Accordingly, it becomes difficult to sufficiently increase the arrangement density of the electric wiring.

Meanwhile, in the method disclosed in JP-A-2005-311122 and JP-A-2006-140247, electric connection is obtained by using plating metal isotropically grown by an electroless plating method in the state in which the connection terminal of the wiring substrate and the connection terminal of the semiconductor device are separated from each other, and joining plating metal between the connection terminals separated from each other.

Since the plating metal isotropically grows as described above, when the plating metal is grown so as to join the connection terminals separated from each other, the plating metal widely expands at the same time in the width direction of the wiring pattern which is formed by plating (direction orthogonal to direction in which connection terminals to be joined are connected). Therefore, in order to prevent an unintended short circuiting, the adjacent connection terminals in the wiring substrate, or the adjacent connection terminals in the semiconductor device have to be separated from each other. As a result, the arrangement density of the connection terminals cannot be sufficiently increased, and it is difficult to reduce the size of the wiring substrate or the semiconductor device.

SUMMARY

An advantage of some aspects of the invention is to provide a conduction structure that can easily cause wiring between substrates to be disposed at high density, an effective method of manufacturing a conduction structure, a droplet ejecting head that includes the conduction structure and can easily cause the size thereof to be reduced, and a printing apparatus including the droplet ejecting head.

An aspect of the invention is directed to a conduction structure including a first substrate that has a main surface, an end surface continued to the main surface in a non-parallel manner, and a first conductive portion provided on the end surface; a second substrate that has a main surface, an end surface continued to the main surface in a non-parallel manner, and a second conductive portion provided on the end surface, and that is provided so that the main surface thereof faces the main surface of the first substrate; and a plating layer that electrically connects the first conductive portion and the second conductive portion.

With this configuration, since the conductive layer is formed by using end surfaces of the respective substrates, and metal is deposited on the conductive layer to obtain the plating layer, it is possible to correctly form the wiring when the arrangement density of the wiring to be formed is high. Therefore, it is possible to obtain the conduction structure that can easily cause the wiring between substrates to be disposed at high density.

In the conduction structure according to the aspect of the invention, it is preferable that, in the first substrate, an angle formed between the main surface and the end surface is greater than 0° and less than 90°, and in the second substrate, an angle formed between the main surface and the end surface is greater than 0° and less than 90°.

With this configuration, it is possible to reduce the size of the conduction structure, and to easily form the conductive layer on the end surface.

In the conduction structure according to the aspect of the invention, it is possible that the second substrate is made of silicon as a main material.

With this configuration, if the second substrate is an IC, the performance is excellent. Further, if the first substrate is also made of silicon as a main material, the thermal expansions of the first substrate and the second substrate are close to each other. Therefore, it is possible to suppress the generation of a defect such as a distortion in the conduction structure.

In the conduction structure according to the aspect of the invention, it is preferable that the end surface of the second substrate is configured with a plane of (1, 1, 1) silicon surface orientation.

With this configuration, it is possible to enhance the accuracy of the inclination angle to the main surface and to enhance the planarization of the end surface. As a result, it is possible to enhance the arrangement density of the wiring when the conductive layer and the plating layer are formed on the end surface as the wiring.

In the conduction structure according to the aspect of the invention, it is preferable that the end surface of the first substrate and the end surface of the second substrate are positioned on the same surface.

With this configuration, the visibility of the first conductive portion provided on the end surface of the first substrate and the second conductive portion provided on the end surface of the second substrate increases so that the efficiency of the inspection can be enhanced. That is, when the first conductive portion and the second conductive portion are enlarged and observed, it is easy to bring the focus of the magnifier onto the first conductive portion and the second conductive portion. Therefore, it is possible to reduce the time required to view the first conductive portion and the second conductive portion so that the time required for the inspection can be reduced.

In the conduction structure according to the aspect of the invention, it is preferable that the end surface of the first substrate and the end surface of the second substrate are positioned in a deviated manner.

With this configuration, if the conductivity layer is provided on the main surface of the first substrate, the contact area of the conductive layer and the plating layer is enlarged. As a result, it is possible to enhance the reliability of the electric connection between the conductive layer and the plating layer.

In the conduction structure according to the aspect of the invention, it is preferable that the first substrate further includes an electric circuit connected to the first conductive portion.

With this configuration, since the connection resistance between the first conductive portion and the electric circuit is reduced, it is possible to enhance the operation stability of the electric circuit.

Another aspect of the invention is directed to a method of manufacturing a conduction structure including a first substrate that has a main surface, an end surface continued to the main surface in a non-parallel manner, and a first conductive portion provided on the end surface, a second substrate that has a main surface, an end surface continued to the main surface in a non-parallel manner, and a second conductive portion provided on the end surface, and that is provided so that the main surface thereof faces the main surface of the first substrate, and a plating layer that electrically connects between the first conductive portion and the second conductive portion, in which the method includes bonding the first substrate and the second substrate so that a position of the first conductive portion and a position of the second conductive portion are matched with each other; and depositing the plating layer respectively on the first conductive portion and the second conductive portion by a plating method.

With this configuration, it is possible to effectively manufacture the conduction structure that can easily cause the wiring between the substrates to be disposed at high density.

In the method of manufacturing a conduction structure according to the aspect of the invention, it is preferable that the end surface of the first substrate and the end surface of the second substrate are formed by an anisotropic etching method.

With this configuration, it is possible to easily shape an angle between a surface to be processed (end surface) and the main surface of the base material which is a work piece as designed. Therefore, it is possible to easily perform the processing into a desired shape, and it is possible to form the inclination angle of the end surfaces to be close to the shape as designed.

In the method of manufacturing a conduction structure according to the aspect of the invention, it is preferable that the first conductive portion and the second conductive portion are formed by forming a metallic film by a sputtering method and patterning the metallic film by a photolithographic method.

In the sputtering method, since it is possible to form a metallic film having a high adhesive property at a comparatively low temperature, the heat effect on the respective substrates followed by the film formation is suppressed to the minimum, to contribute to the realization of the conduction structure with high accuracy. Also, since the control of the film thickness is comparatively easy, it is possible to obtain the metallic film which is highly uniform in thickness. Finally, it is possible to enhance the accuracy in patterning the wiring, and to contribute to the formation of the wiring to be at high density.

In the method of manufacturing a conduction structure according to the aspect of the invention, it is preferable that the plating method is an electroless plating method.

With this configuration, it is possible to selectively deposit metal on the conductive portion, and it is possible to easily form the plating layer.

Still another aspect of the invention is directed to a droplet ejecting head including the conduction structure according to the aspect of the invention.

With this configuration, it is possible to obtain a droplet ejecting head which is small and has high reliability.

Yet another aspect of the invention is directed to a printing apparatus including the droplet ejecting head according to the aspect of the invention.

With this configuration, it is possible to obtain a printing apparatus which is small and has high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a conduction structure, a method of manufacturing the conduction structure, a droplet ejecting head, and a printing apparatus according to the invention are described with reference to the preferred embodiments illustrated in the accompanying drawings.

First Embodiment

Droplet Ejecting Head and Conduction Structure

Figure 1:
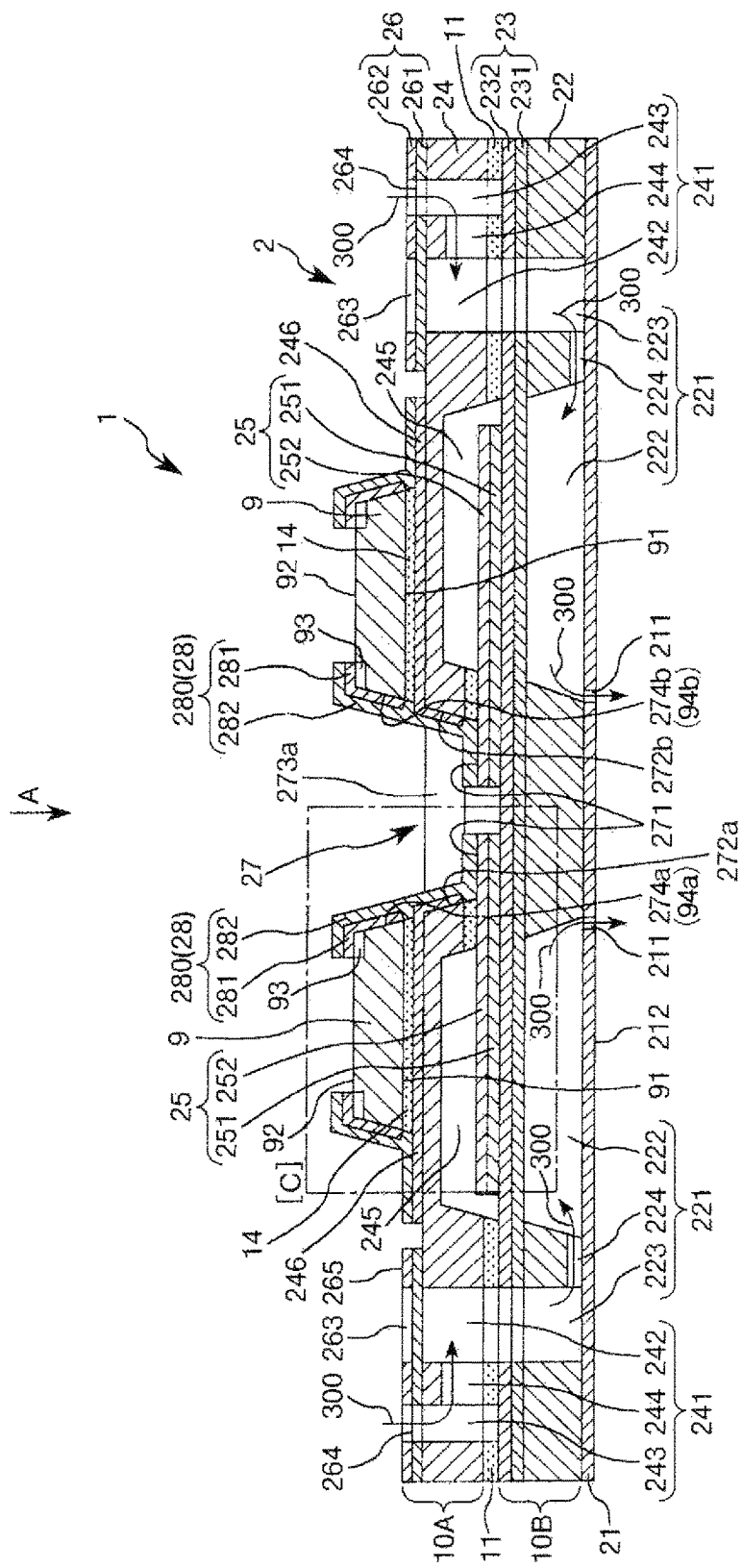
FIG. 1 is a cross-sectional view illustrating a droplet ejecting head to which a conduction structure according to the first embodiment of the invention is applied (droplet ejecting head according to first embodiment of the invention).
Figure 2:
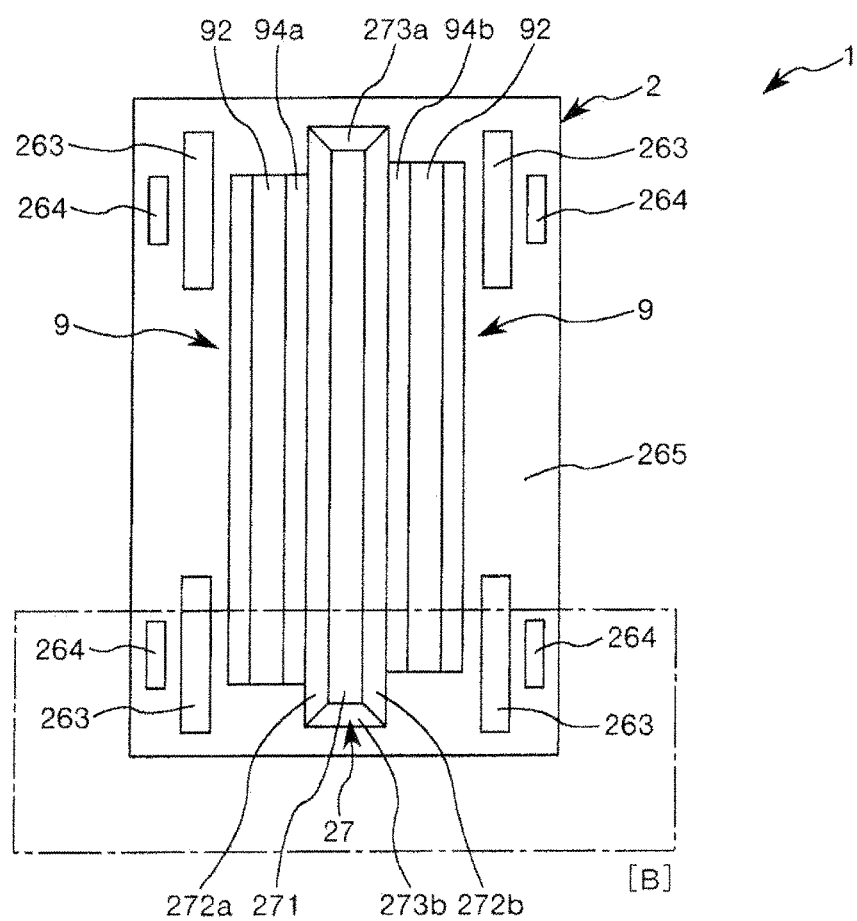
FIG. 2 is a diagram illustrating a droplet ejecting head viewed in the direction of an arrow A illustrated in FIG. 1 (plan view).
Figure 3:
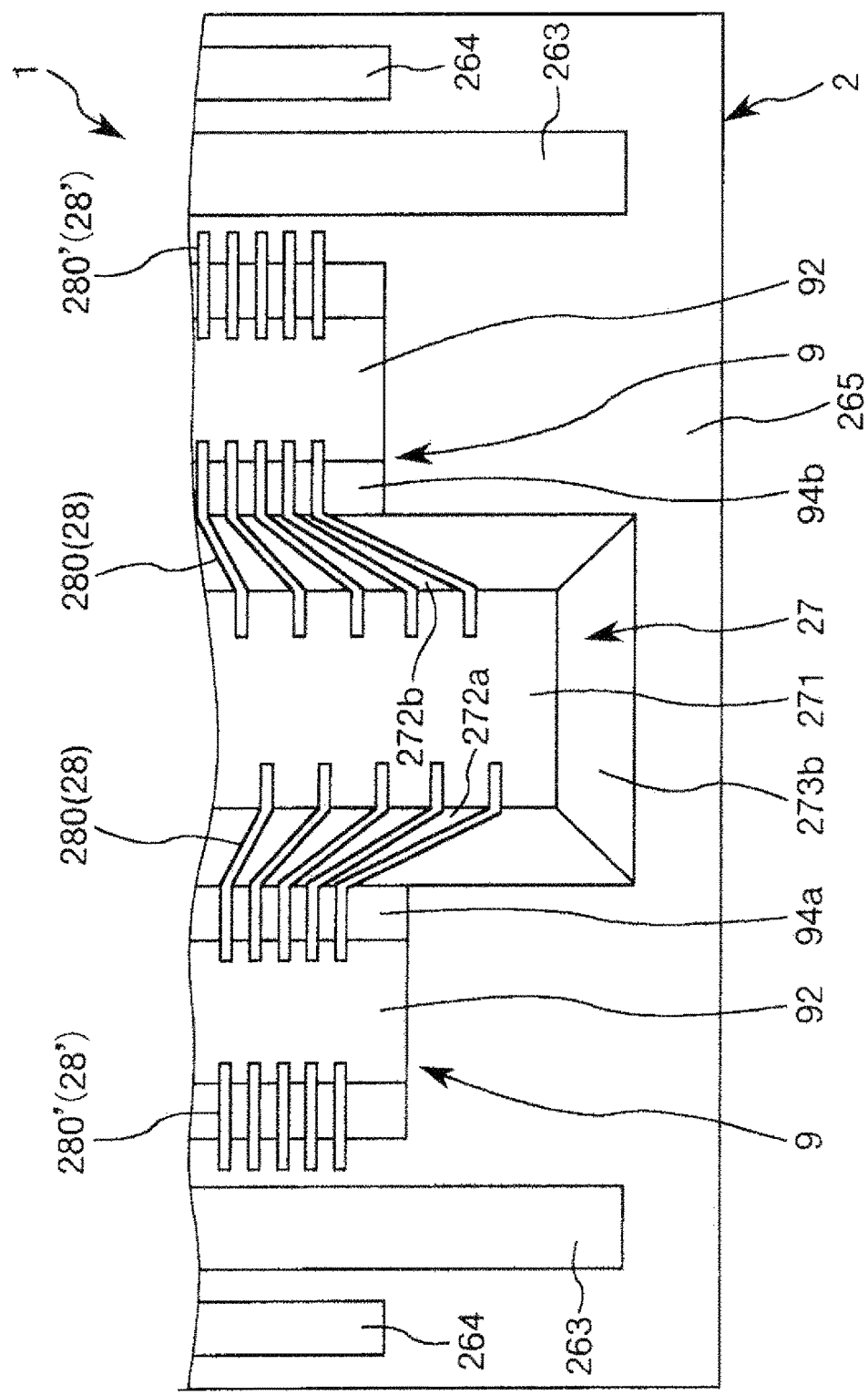
FIG. 3 is an enlarged and detailed view illustrating an area B surrounded by a dashed line in FIG. 2.
Figure 4:
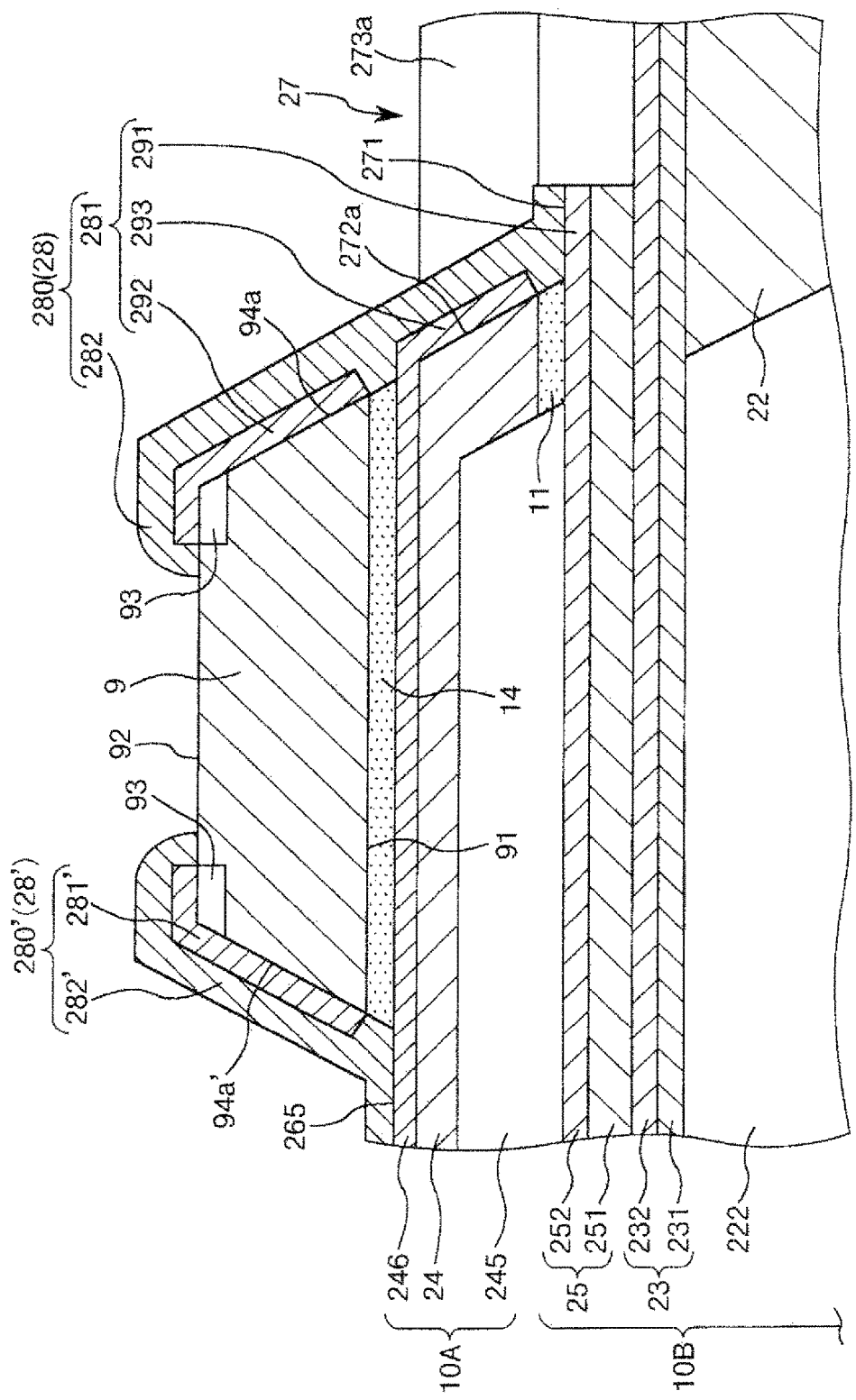
FIG. 4 is an enlarged and detailed view illustrating an area C surrounded by a dashed line in FIG. 1.
Figure 6A:
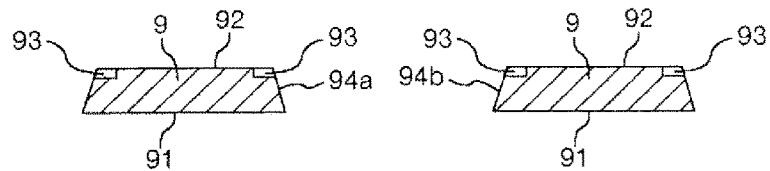
FIGS. 6A to 6C are cross-sectional views illustrating the method of manufacturing the conduction structure according to the first embodiment.
Figure 6B:
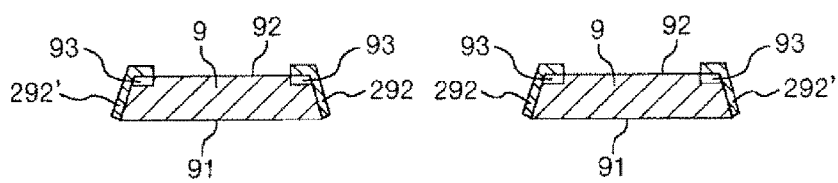
Figure 6C:
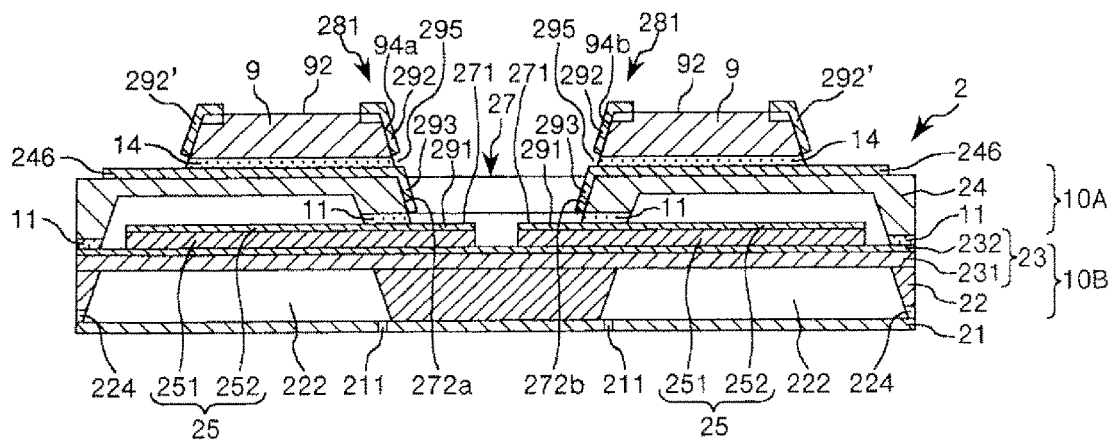
Figure 7A:
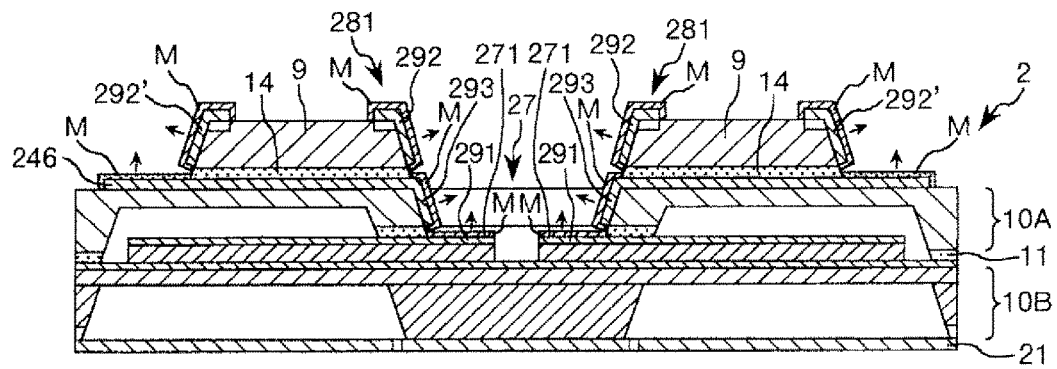
FIGS. 7A and 7B are cross-sectional views illustrating the method of manufacturing the conduction structure according to the first embodiment.
Figure 7B:
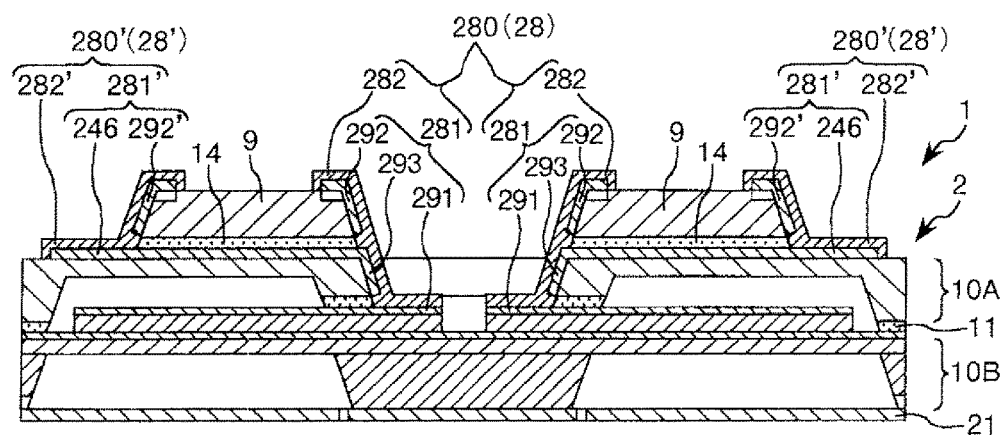
Figure 8:
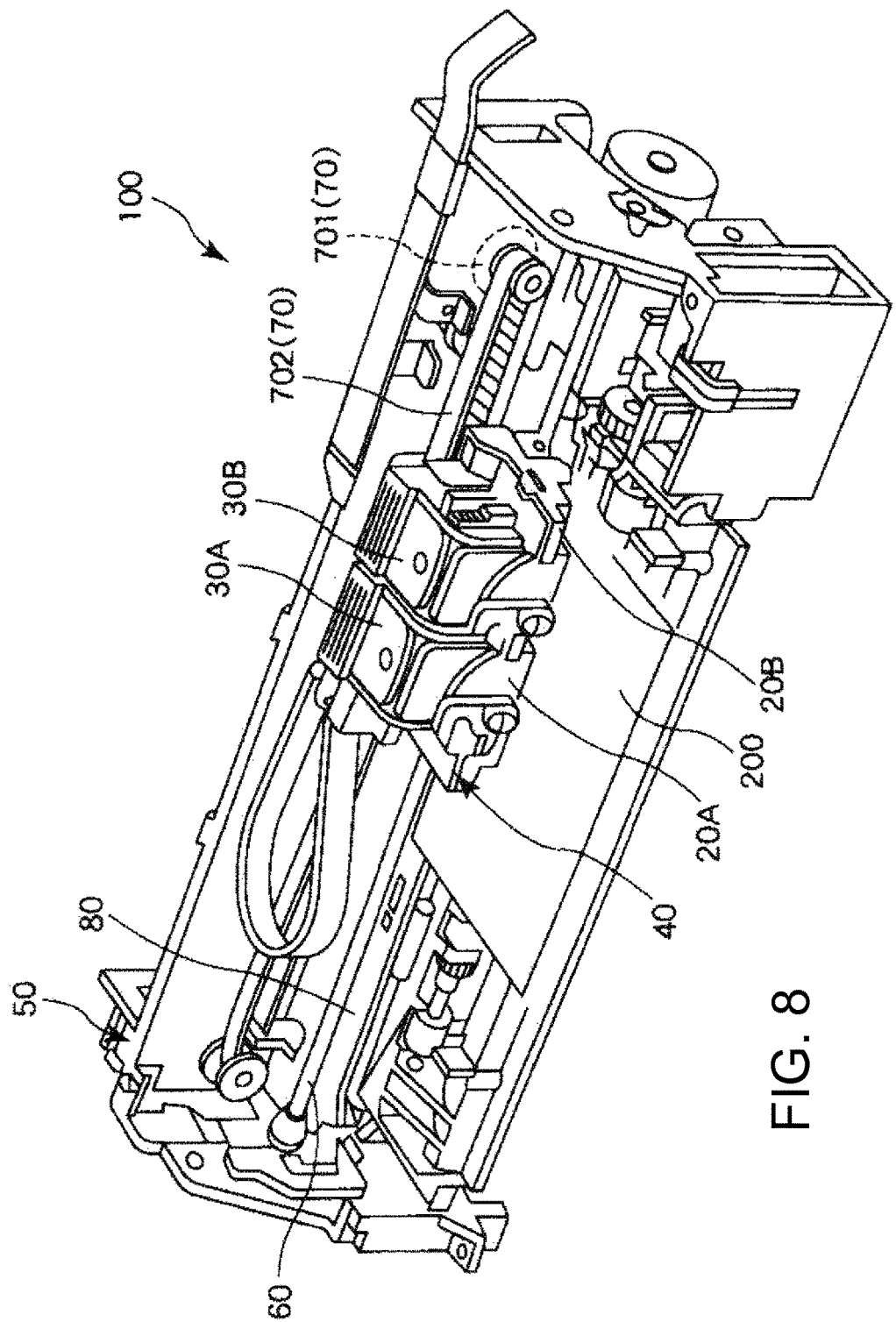
FIG. 8 is a perspective view illustrating a printing apparatus according to an embodiment of the invention.

FIG. 1 is a cross-sectional view illustrating a droplet ejecting head to which a conduction structure according to the first embodiment of the invention is applied (droplet ejecting head according to the first embodiment of the invention), FIG. 2 is a diagram illustrating a droplet ejecting head viewed in the direction of an arrow A illustrated in FIG. 1 (plan view), FIG. 3 is an enlarged and detailed view illustrating an area B surrounded by a dashed line in FIG. 2, FIG. 4 is an enlarged and detailed view illustrating an area C surrounded by a dashed line in FIG. 1, FIGS. 5A to 7B are cross-sectional views illustrating a method of manufacturing the conduction structure according to the first embodiment, and FIG. 8 is a perspective view illustrating a printing apparatus according to an embodiment of the invention. Hereinafter, for convenience of the description, upper sides of FIGS. 1 and 4 to 7B are referred to as "up" or "upper", and lower sides thereof are referred to as "under" or "lower".

A droplet ejecting head 1 illustrated in FIGS. 1 to 4 includes a base substrate 2 configured with a plate body, and an integrated circuit (IC) 9 arranged on the base substrate 2. The droplet ejecting head 1 is mounted on a printing apparatus (droplet ejecting apparatus) 100 as described below, and can perform printing on a recording medium 200 by ejecting ink 300 onto the recording medium 200 such as printing paper as droplets (see FIG. 8).

As illustrated in FIG. 2, the base substrate 2 has a rectangular shape in a plan view. The base substrate 2 includes a sealing plate 10A, a device substrate 10B, and a nozzle substrate (nozzle plate) 21, and is configured with a stacked body in which the nozzle substrate 21, the device substrate 10B, and the sealing plate 10A are stacked in this sequence from the lower side. In addition, the sealing plate 10A and the device substrate 10B are bonded via an adhesive layer (adhesive agent) 11. The sealing plate 10A and the device substrate 10B are arranged so that the upper surface of the device substrate 10B and the lower surface of the sealing plate 10A face each other, and are bonded so that the adhesive layer 11 is interposed therebetween.

Meanwhile, the IC 9 and the sealing plate 10A are bonded via an adhesive layer (adhesive agent) 14. Then, the IC 9 and the sealing plate 10A are arranged so that the upper surface of the sealing plate 10A and the lower surface of the IC 9 face each other, and are bonded so that the adhesive layer 14 is interposed therebetween.

The device substrate 10B, the sealing plate 10A, and the IC 9 according to the first and second embodiments of the invention to be described below all have plate shapes which extend in the horizontal direction of FIG. 4. Therefore, in the descriptions according to the first and second embodiments, among two main surfaces included in each of the device substrate 10B, the sealing plate 10A, and the IC 9, a main surface positioned on the upper side of FIG. 4 is referred to as an "upper surface", and the other main surface positioned on the lower side is referred to as a "lower surface".

Thicknesses of the adhesive layers 11 and 14 are not particularly limited, and may be, for example, in the range of 0.1 μm to 5 μm, and preferably in the range of 0.5 μm to 2 μm. Also, the device substrate 10B and the nozzle substrate are bonded together via the adhesive layer (not illustrated).

The sealing plate 10A is configured with a stacked body in which a reservoir forming substrate (protection substrate) 24 and a compliance substrate 26 are included, and are stacked from the lower side in this sequence. Also, the device substrate 10B is also configured with a stacked body in which a flow channel forming substrate 22, a diaphragm 23, and a plurality of piezoelectric elements 25 are included, and are stacked from the lower side in this sequence. Also, in the respective stacked bodies, respective layers that configure the stacked bodies are bonded via adhesive layers or heat welding films (not illustrated).

Since the base substrate 2 is configured with the stacked body, the respective layers that configure the stacked body can be used according to the purposes and functions thereof. Accordingly, the thin droplet ejecting head 1 can be obtained, and the size of the printing apparatus 100 can be reduced.

The nozzle substrate 21 as illustrated in FIG. 1 has a plurality of ejection ports (nozzle openings) 211 that are formed to penetrate the nozzle substrate 21, that is, to be open to a lower surface 212 of the base substrate 2 (plate body). The ejection ports 211 are arranged in a matrix shape. One or more ejection ports 211 according to the present embodiment are arranged in a longitudinal direction (long side direction) of the base substrate 2, and two columns are arranged in the width direction (short side direction).

It is preferable that water repellent coating layers be provided on the respective ejection ports 211. Accordingly, the droplets ejected from the respective ejection ports 211 easily fall in the vertical direction, and can be correctly land on the positions at which the droplets should land on the recording medium 200.

Further, the configuration materials of the nozzle substrate 21 are not particularly limited, but a silicon material or stainless steel is preferably used. Since these materials have high resistance to chemicals, even if the materials are exposed to the ink 300 for a long time, the alteration or the deterioration of the nozzle substrate 21 can be securely prevented. Also, since the materials have high workability, the nozzle substrate 21 with high dimensional accuracy can be obtained. Therefore, a highly reliable droplet ejecting head 1 can be obtained.

Flow channels (cavities) 221 that cause the ink 300 to flow to the respective ejection ports 211 are formed in the flow channel forming substrate 22. The flow channels 221 are formed, for example, by etching. As illustrated in FIG. 1, the flow channels 221 can each be divided into a pressure generating chamber 222, a relay chamber (communication portion) 223, and a communication route (supply route) 224 that causes the pressure generating chamber 222 and the relay chamber 223 to communicate with each other.

The pressure generating chamber 222 is provided to correspond to the respective ejection ports 211, and communicates with the outside via the corresponding ejection ports 211.

The relay chamber 223 is provided on the upper stream side of the pressure generating chamber 222.

Also, the communication route 224 is provided between the pressure generating chamber 222 and the relay chamber 223.

The configuration material of the flow channel forming substrate 22 is not particularly limited, and for example, may use the same configuration material as the nozzle substrate 21.

The diaphragm 23 can vibrate in the thickness direction by driving the piezoelectric elements 25 described below. Also, a portion of the diaphragm 23 comes into contact with the pressure generating chamber 222. The pressure in the pressure generating chamber 222 changes due to the vibration of the diaphragm 23 so that the ink 300 is ejected as droplets from the pressure generating chamber 222 via the ejection ports 211.

The diaphragm 23 is obtained by sequentially stacking an elastic film 231 and the lower electrode film 232 from the flow channel forming substrate 22 side. The elastic film 231 is configured with a silicon oxide film having a thickness, for example, in the range of 1 μm to 2 μm. The lower electrode film 232 is configured with a metal film having a thickness, for example, of about 0.2 μm. The lower electrode film 232 also functions as common electrodes of the plurality of piezoelectric elements 25 arranged between the flow channel forming substrate 22 and the reservoir forming substrate 24.

In the reservoir forming substrate 24, reservoirs 241 that temporarily store the ink 300 are formed to communicate with the respective flow channels 221 of the flow channel forming substrate 22. As illustrated in FIG. 1, the reservoirs 241 each include a first chamber (reservoir portion) 242, a second chamber (introduction route) 243, and a communication route 244 that cause the first chamber 242 and the second chamber 243 to communicate with each other.

The first chamber 242 is positioned on the upper portion of the relay chamber 223 of the flow channels 221 in the flow channel forming substrate 22. Also, the diaphragm 23 is penetrated at a portion between the first chamber 242 and the relay chamber 223 so that the first chamber 242 and the relay chamber 223 communicate with each other.

The second chamber 243 is provided on the upper stream side of the first chamber 242.

The communication route 244 is provided between the first chamber 242 and the second chamber 243.

Also, in the droplet ejecting head 1, the relay chamber 223 may configure a portion of the reservoirs 241.

Also, piezoelectric element receiving chambers 245 that each receive the piezoelectric element 25 are formed in the reservoir forming substrate 24. The piezoelectric element receiving chambers 245 are formed to be separated from the reservoirs 241.

The configuration materials of the reservoir forming substrate 24 are not particularly limited, and may use, for example, silicon or glass.

The respective piezoelectric elements 25 are formed by stacking a piezoelectric film (piezo element) 251 and an upper electrode film 252 sequentially from the lower electrode film 232 side. When the voltage is applied between the upper electrode film 252 and the lower electrode film 232, the piezoelectric film 251 is deformed by the piezoelectric effect. According to the deformation, the diaphragm 23 vibrates in the vertical direction. As described above, the pressure in the pressure generating chamber 222 is changed due to the vibration of the diaphragm 23 so that the ink 300 can be ejected from the corresponding pressure generating chamber 222 via the ejection ports 211 as droplets. As described above, the respective piezoelectric elements 25 are configured so as to eject the ink 300 (droplet) from the respective ejection ports 211 via the diaphragm 23.

The compliance substrate 26 is formed by stacking a sealing film 261 and a fixing plate 262 sequentially from the reservoir forming substrate 24 side. The sealing film. 261 is configured with a flexible material (for example, a polyphenylene sulfide film having a thickness of about 6 μm). A portion of the sealing film 261 comes into contact with the reservoir 241. Also, the fixing plate 262 is configured with a comparatively hard material (for example, stainless steel having a thickness about 30 μm) such as a metallic material. In the fixing plate 262, a portion that comes into contact with the reservoirs 241 side, and defective portions 263 in which the corresponding portion is defective are formed.

Introduction ports 264 that penetrate the sealing film 261 and the fixing plate 262 together are formed on the compliance substrate 26. The introduction ports 264 are portions that respectively communicate with the reservoirs 241, and introduce the ink 300 to the corresponding reservoirs 241.

A concave portion 27 that is open toward a central portion of an upper surface 265 of the sealing plate 10A (the compliance substrate 26) as illustrated in FIG. 1 is formed in the base substrate 2 configured with the stacked body as described above. The concave portion 27 is formed by cutting the sealing plate 10A by etching until the sealing plate 10A is penetrated in the thickness direction.

As illustrated in FIGS. 1 and 2, the concave portion 27 has a groove shape along the longitudinal direction of the base substrate 2. Also, the concave portion 27 includes a bottom portion 271, first side wall portions (side wall portions) 272a and 272b that stand from the bottom portion 271, and face each other in the width direction (intersecting direction) of the concave portion 27 (groove), and second side wall portions 273a and 273b that stand from the bottom portion 271, and face each other in the longitudinal direction of the concave portion 27.

In a concave portion 270, the bottom portion 271 becomes a flat portion.

In addition, the first side wall portions 272a and 272b are inclined toward the bottom portion 271 (and the upper surface 265 of the sealing plate 10A). Further, the inclination angle is not particularly limited, but if the reservoir forming substrate 24 is configured with silicon, the inclination angle can be appropriately set according to the surface orientation, and an inclination angle of 54.7° or 35.7° can be easily formed. In addition, the first side wall portion 272a and the first side wall portion 272b are configured so that the separation distance gradually increases moving to the upper surface 265 side.

The second side wall portion 273a and the second side wall portion 273b are also inclined toward the bottom portion 271 in the same manner as the first side wall portions 272a and 272b. Also, the second side wall portion 273a and the second side wall portion 273b are configured so that the separation distance gradually increases moving to the upper surface 265 side.

In this manner, since the first side wall portions 272a and 272b and the second side wall portions 273a and 273b are inclined respectively, when the concave portion 27 is formed, for example, by etching, the formation can be performed easily and securely.

The bottom portion 271 is a portion corresponding to the upper surface of the device substrate 10B. Also, the first side wall portions 272a and 272b, and the second side wall portions 273a and 273b are configured including end surfaces of the sealing plate 10A. The end surfaces continue to the upper surface and the lower surface of the sealing plate 10A, and are inclined to the upper surface and the lower surface as described above.

As illustrated in FIG. 1, the IC 9 includes an electronic circuit (electric circuit) (not illustrated) formed on a semiconductor substrate and a plurality of terminals (terminal portions) 93 electrically connected to the electronic circuit.

According to the first embodiment, two ICs 9 are arranged with the concave portion 27 interposed therebetween as illustrated in FIGS. 1 to 3.

The IC 9 uses various semiconductor materials such as silicon, germanium, or a compound semiconductor material, as a main material, and among them silicon is preferably used as the main material. Since the IC 9 including silicon as the main material has an excellent performance and a thermal expansion which is similar to that of the reservoir forming substrate 24, the generation of a distortion can be suppressed.

As described above, a lower surface 91 of the IC 9 is bonded to the upper surface 265 of the sealing plate 10A via the adhesive layer 14. Also, an upper surface 92 of the IC 9 is substantially parallel to the lower surface 91.

Meanwhile, an end surface 94a of the IC 9 is positioned on the same surface with the first side wall portion 272a of the sealing plate 10A described above, as illustrated in FIG. 4. Also, an end surface 94b of the IC 9 which is different from the IC 9 described above is provided at a position facing the end surface 94a in the width direction of the concave portion 27. As illustrated in FIG. 1, the end surface 94b is also positioned on the same surface with the first side wall portion 272b of the sealing plate 10A described above.

As illustrated in FIG. 4, the end surfaces 94a and 94b may not be parallel to the lower surface 91 of the IC 9. That is, angles formed by the end surfaces 94a and 94b with the lower surface 91 must be greater than 0°.

In addition, the angle formed by the end surfaces 94a and 94b with the lower surface 91 may be 90° (right angle). However, in order to reduce the size of the droplet ejecting head 1, it is preferable that the angles formed by the end surfaces 94a and 94b with the lower surface 91 be respectively less than 90°, that is, the end surfaces 94a and 94b are inclined toward the lower surface 91, and it is more preferable that the angles be in the range of 30° to 75°. Accordingly, it is possible to reduce the sizes of the conduction structure and the droplet ejecting head 1, and to easily form wiring patterns 28 on the end surfaces 94a and 94b.

In the case of the IC 9 using silicon as the main material, it is preferable to form the end surfaces 94a and 94b on a plane of (1, 1, 1) silicon surface orientation. The planarization of the end surfaces 94a and 94b is enhanced, and the accuracy of the inclination angles of the end surfaces 94a and 94b can be increased by using the surface as the end surfaces 94a and 94b. Accordingly, when the wiring patterns 28 are formed on the end surfaces 94a and 94b as described below, the arrangement density can be increased.

Also, in this case, with respect to the reservoir forming substrate 24, it is preferable that the first side wall portions 272a and 272b be configured on a plane of (1, 1, 1) silicon surface orientation. Accordingly, the end surface 94a and the first side wall portion 272a are parallel to each other, and the end surface 94b and the first side wall portion 272b are parallel to each other. Therefore, the end surface 94a and the first side wall portion 272a can be easily positioned on the same surface, and the end surface 94b and the first side wall portion 272b can be easily positioned on the same surface in the same manner.

The silicon surface orientation that configures the end surfaces 94a and 94b is not limited to the above, and may be, for example, a plane of (1, 0, 0) surface orientation.

The terminals 93 are input/output terminals of the IC 9, and are provided so as to be exposed to a portion of the upper surface 92 of the IC 9. In addition, in view of the wiring length in a wiring pattern described below, it is preferable that the terminals 93 be positioned near the end surfaces 94a and 94b. A configuration material of the terminals 93 is not particularly limited, but a metallic material having low electrical resistance such as gold or copper can be used.

As illustrated in FIGS. 1, 3, and 4, the wiring patterns 28 are provided in the concave portion 27. The wiring patterns 28 are configured with multiple lines of linear wiring 280. The wiring 280 are arranged in a distributed manner on the first side wall portions 272a and 272b sides. Further, the wiring patterns 28 are not illustrated in FIG. 2.

The multiple lines of wiring 280 on the first side wall portion 272a side and the multiple lines of wiring 280 on the first side wall portion 272b side are separated from each other in the width direction of the concave portion 27 (the base substrate 2).

Further, as illustrated in FIG. 3, the adjacent lines of wiring 280 on the first side wall portion 272a side are separated from each other in the longitudinal direction of the concave portion 27, that is, the adjacent lines of wiring 280 are arranged in the longitudinal direction of the concave portion 27 at intervals. That is, the distance between the lines of wiring 280 increases moving toward the bottom portion 271 side of the concave portion 27. The short circuiting of the adjacent lines of wiring 280 is prevented on the first side wall portion 272a side by forming such intervals.

In the same manner, the adjacent lines of wiring 280 on the first side wall portion 272b side are arranged in the longitudinal direction of the concave portion 27 at intervals. Also, the intervals of the lines of wiring 280 are also increased moving toward the bottom portion 271 side of the concave portion 27.

Hereinafter, the configuration of the wiring 280 is more specifically described, but the wiring 280 illustrated in FIG. 4 is representatively described below. In addition, the description in the same manner can be applied to the other lines of wiring 280.

The wiring 280 illustrated in FIG. 4 is one continued line of a conducting path electrically connecting the upper surface 92 of the IC 9 to the bottom portion 271 of the concave portion 27 via the end surface 94a of the IC 9 and the first side wall portion 272a. The IC 9 and the piezoelectric elements are electrically connected to each other through the conduction structure including the wiring 280 so that the droplet ejecting head 1 can be operated. Here, the wiring 280 according to the first embodiment has a stacked structure, and includes conductive portions 281 positioned on the end surface 94a side, the first side wall portion 272a side, and the piezoelectric film 251 side, and plating layers 282 provided so as to be overlapped with the conductive portion 281 on the opposite side of the end surface 94a, the first side wall portion 272a, and the piezoelectric film 251 in FIG. 4. The electrical resistance of the wiring patterns 28 can be decreased by forming the wiring 280 to have a two-layered structure so that the electric power consumption of the droplet ejecting head 1 can be decreased and the speed of the operation of the piezoelectric element 25 can be increased. Also, since it is difficult to short circuit the wiring 280, the reliability of the droplet ejecting head 1 can be improved.

In the wiring 280, the conductive portion 281 illustrated in FIG. 4 can be divided into three parts. Specifically, the conductive portion 281 can be divided into a conductive portion 291 provided on the bottom portion 271 of the concave portion 27 (upper surface of the device substrate 10B), a conductive portion 292 provided from the upper surface 92 to the end surface 94a of the IC 9, and a conductive portion 293 provided on the end surface of the sealing plate 10A (the first side wall portion 272a of the concave portion 27). In addition, a portion between the conductive portion 291 and the conductive portion 293 and a portion between the conductive portion 292 and the conductive portion 293 may be in contact with each other, but in the first embodiment, the portions are separated from each other as illustrated in FIG. 4. In addition, the conductive portion 291 according to the first embodiment is a portion of the upper electrode film 252 of the piezoelectric element 25.

As illustrated above, the end surface 94a of the IC 9 and the end surface of the sealing plate 10A (the first side wall portion 272a of the concave portion 27) are positioned on the same surface. Accordingly, the visibility of the conductive portion 281 provided on the end surfaces is increased so that the efficiency of the inspection can be enhanced. That is, when the conductive portion 281 is enlarged and observed, it is easy to bring the focus of the magnifier onto the respective portions of the conductive portion 281. Therefore, it is possible to reduce the time required to view the conductive portion 281, and the time required for the inspection can be reduced.

The state in which the end surface 94a of the IC 9 and the end surface of the sealing plate 10A are positioned on the same surface refers to a state in which an angle formed between two surfaces is less than 5°, and the step of the two surfaces is less than 100 μm.

Meanwhile, the plating layer 282 illustrated in FIG. 4 is provided so as to be overlapped with the conductive portion 281 as described above. Accordingly, the conductive portion 281 can be reinforced, and electrical connections between the conductive portion 291 and the conductive portion 293 and between the conductive portion 292 and the conductive portion 293 are respectively formed. As a result, it is possible to obtain the wiring 280 which is highly reliable and highly conductive.

The plating layer 282 is formed by various plating methods. In the plating method, a film can be formed by depositing a metallic component on a ground portion. Therefore, the plating layer 282 can be naturally grown in a linear shape by forming the conductive portion 281 in a linear shape in advance. In other words, while maintaining the shape of the conductive portion 281 on the ground portion, the plating layer 282 can be formed. As a result, if the wiring 280 is to be formed at high density (if the fine wiring pattern is formed at a narrow pitch), the correct manufacturing of the wiring 280 can be easily performed.

Further, since the wiring 280 has a two-layered structure as described above, and one of the two layers is the plating layer 282, the thickness thereof can be easily adjusted. Therefore, it is easy to cause the wiring 280 to be disposed at high density and to have low electrical resistance at the same time so that the electric power consumption of the droplet ejecting head 1 can be decreased, and the speed of the operation of the piezoelectric elements 25 can be increased at the same time.

In other words, it becomes easy to cause the wiring 280 to be fine by causing the wiring 280 to have a two-layered structure. If the wiring 280 has the two-layered structure, even if the line width is the same, the increase in the electrical resistance can be easily suppressed, and therefore it becomes easy to cause the wiring 280 to be fine. In this regard, it is possible to cause the wiring 280 to be disposed at high density.

In the droplet ejecting head 1 according to the first embodiment, the IC 9 is mounted in a state in which the terminal 93 of the IC 9 is positioned on the opposite side of the mounting surface, that is, a face-up state. Therefore, compared with the case in which the IC 9 is mounted in the face-down state, even if the IC 9 is mounted on the base substrate 2, the connection portion of the terminal 93 and the wiring 280 can be directly seen. As a result, there is an advantage in that the inspection operation of the connection state of the terminal 93 and the wiring 280 can be easily performed.

Further, since the wiring 280 relating to the first embodiment are constructed by using the inclined surfaces as described above, the wiring 280 can be easily viewed in the direction A in FIG. 1. Therefore, there is an advantage in that the inspection of the wiring 280 can be easily performed, the conductive portion 281 can be easily formed by the film forming methods described below, and the thickness of the conductive portion 281 can be easily uniformized.

The sealing plate 10A according to the first embodiment includes a conductive layer 246 provided on the upper surface of the reservoir forming substrate 24. The conductive layer 246 is provided, if necessary. Therefore, the conductive layer 246 may be omitted, but may have electrical wiring formed by patterning. That is, an arbitrary electronic circuit may be formed on the sealing plate 10A. In this case, the conductive layer 246 is electrically connected to the wiring 280 by using a portion of the conductive layer 246 as the conductive portion 293. Therefore, the electronic circuit formed on the sealing plate 10A can be electrically connected to the IC 9 or the piezoelectric elements 25. In other words, the IC 9, the electronic circuit of the sealing plate 10A, and the piezoelectric elements 25 can be three-dimensionally connected through the wiring 280.

The conductive layer 246 and the wiring 280 may be connected by using all the wiring 280, or by selectively using certain wiring 280. That is, in the wiring pattern 28, in addition to the wiring 280 that electrically connects the piezoelectric elements 25 and the IC 9, the wiring 280 that connects the conductive layer 246 and the piezoelectric elements 25, the wiring 280 that connects the IC 9 and the conductive layer 246, and the like are included.

The conductive portion 281 or the conductive layer 246 includes a conductive material such as Ni, Pd, Au, Al, Ti, Ti—W, or Cu, singly or as a compound.

Further, the conductive portion 281 or the conductive layer 246 may have a single layer structure, or a stacked structure in which a plurality of layers are overlapped. In the latter case, it is preferable that a ground-side layer (layer far from the plating layer 282) be configured with a Ni—Cr-based alloy, and a layer on the plating layer 282 side be configured with Au. Accordingly, both the adhesion and the conductivity of the conductive portion 281 can be achieved.

Meanwhile, the plating layer 282 has conductivity, and is configured with a material that can be deposited through a plating method. Examples of the material include Ni, Cu, Au, Pd, Co, Sn, and Ag. In addition, a material that can be codeposited through the plating method may be included in the plating layer 282. Examples of the corresponding material include P, B, and Bi.

The conduction structure according to the first embodiment that is configured to conduct the IC 9 and the piezoelectric element 25 via the wiring pattern 28 is advantageous in that it is possible to cause the wiring pattern 28 to be disposed at high density and to cause easy manufacture of the wiring pattern 28. In addition, since the corresponding conduction structure is configured so as to construct the wiring pattern 28 by using the inclination surface, there is an advantage in that highly accurate machining such as the photolithographic method can be applied. Therefore, when the wiring pattern 28 is constructed so that substrates are joined to each other in the thickness direction of the stacked substrates, the conduction structure according to the first embodiment is highly advantageous in that it is possible to cause the wiring pattern 28 to be disposed at high density and to cause easy manufacture of the wiring pattern 28.

If necessary, the plurality of sealing plates 10A may be interposed between the IC 9 and the device substrate 10B. Also, instead of the sealing plate 10A, another member may be interposed. In this case, it is possible to achieve the advantages described above.

The number of ICs 9 mounted on one droplet ejecting head 1 is not particularly limited, and may be greater or less than that according to the first embodiment.

Meanwhile, among the respective ICs 9, the wiring pattern 28' formed with wiring 280' including a conductive portion 281' and a plating layer 282' is constructed on an end surface 94a' on the opposite side to the end surface 94a in which the wiring pattern 28 is constructed. The configuration of the wiring 280' (the wiring pattern 28') described here is the same as that of the wiring 280 (the wiring pattern 28) described above. Accordingly, the wiring 280' has the same advantage as the wiring 280 described above. That is, the wiring 280' connects the terminals 93 of the IC 9 and the conductive layer 246. If it is possible to cause the wiring 280' to be highly dense and highly reliable, it is possible to cause the droplet ejecting head 1 to be smaller and more reliable.

In addition, in the drawings, it is illustrated that the wiring 280 and the wiring 280' constructed in the end surfaces of the IC 9 are electrically connected to each other via the conductive layer 246, but it is illustrated just for the convenience for illustration, and the wiring 280 and the wiring 280' may also be electrically insulated.

Method of Manufacturing Conduction Structure

A method of manufacturing a droplet ejecting head (the droplet ejecting head 1 illustrated in FIG. 1) including an embodiment of a method of manufacturing the conduction structure according to the invention is described. Also, in FIGS. 5A to 7B, a portion of the droplet ejecting head 1 is illustrated, and the other portion is omitted.

The method of manufacturing the droplet ejecting head 1 includes a step of preparing the device substrate 10B including the conductive portion 291, the IC 9 including the conductive portion 292, and the sealing plate 10A including the conductive portion 293, bonding the device substrate 10B and the sealing plate 10A in a state in which a position of the conductive portion 291 and a position of the conductive portion 293 are matched, and bonding the sealing plate 10A and the IC 9 in a state in which the position of the conductive portion 292 and the position of the conductive portion 293 are matched, and a step of depositing the plating layers 282 respectively on the conductive portion 291, the conductive portion 292, and the conductive portion 293 by a plating method. Hereinafter, the respective steps are described in sequence.

Figure 5A:
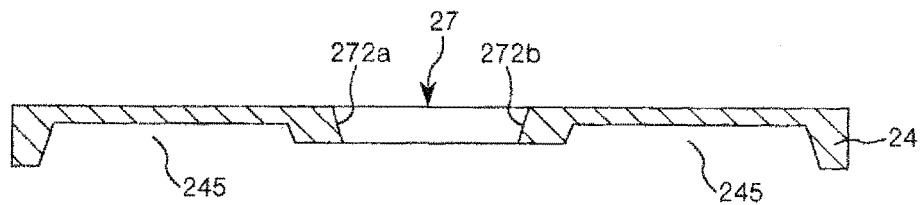
FIGS. 5A to 5C are cross-sectional views illustrating a method of manufacturing the conduction structure according to the first embodiment.

[1] First, the reservoir forming substrate 24 as illustrated in FIG. 5A is prepared. The reservoir forming substrate 24 is formed, for example, by performing processing such as anisotropic etching, on an unprocessed base material. According to the anisotropic etching method, it is possible to easily form an angle between the processed surface and the main surface of the base material as designed. Therefore, it is possible to easily perform the processing into a desired shape. Specifically, after forming the first side wall portion 272a of the concave portion 27, it is possible to form the inclination angle to be close to the shape as designed, and it is possible to particularly enhance the dimensional accuracy of the reservoir forming substrate 24.

If the anisotropic etching is performed, for example, a $SiO_2$ film having a thickness of about 700 nm is formed on an outer surface of the base material by performing thermal oxidation on the base material. Subsequently, patterning is performed by applying a resist on both surfaces of the base material. Then, a portion of $SiO_2$ film is removed by immersing the base material in hydrofluoric acid so that the outer surface of the base material is exposed. Then, after separating the resist, the base material is immersed in a KOH solution having a concentration of about 35% so that the concave portion 27, the piezoelectric element receiving chambers 245, and the like are formed on the base material. Accordingly, the reservoir forming substrate 24 is obtained. Subsequently, after the $SiO_2$ film is etched with the hydrofluoric acid, the thermal oxidation is performed again on the reservoir forming substrate 24, so as to insulate the outer surface of the reservoir forming substrate 24.

Figure 5B:
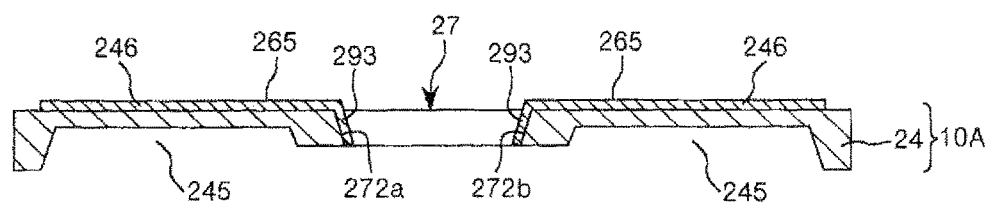

Subsequently, as illustrated in FIG. 5B, the conductive layer 246 is formed on the upper surface of the reservoir forming substrate 24. Thereafter, if necessary, the conductive layer 246 is patterned. Accordingly, it is possible to form the electronic circuit in the conductive layer 246. In addition, the method of forming and patterning the conductive layer 246 is the same as the method of forming and patterning the conductive portions 292 and 292' described below.

In addition, in the formation of the conductive layer 246, the conductive layer 246 is formed to extend to the end surface side of the reservoir forming substrate 24, that is, to the first side wall portion 272a side of the concave portion 27. Accordingly, it is possible to obtain the conductive portion 293 described above.

As described above, the sealing plate 10A can be obtained.

Figure 5C:
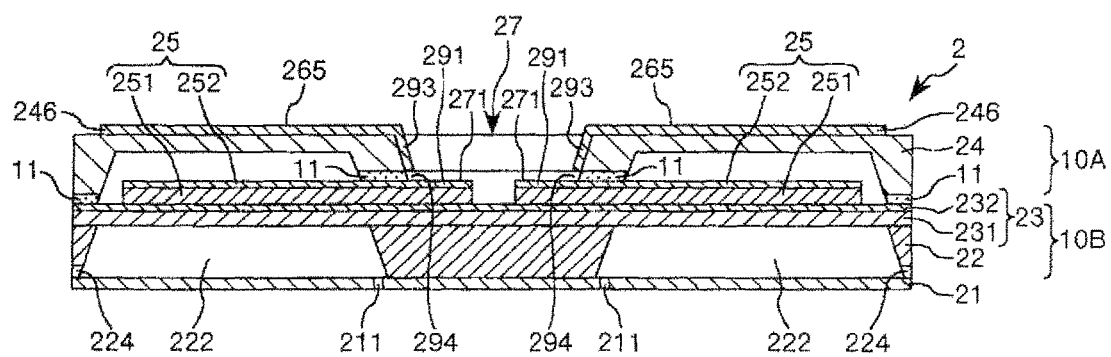

Subsequently, the device substrate 10B as illustrated in FIG. 5C is prepared. The device substrate 10B includes the flow channel forming substrate 22, the diaphragm 23, the plurality of piezoelectric elements 25, and the like as described above. Also, the sealing plate 10A and the device substrate 10B are bonded via the adhesive layer 11. In addition, the flow channel forming substrate 22 is formed after bonding the sealing plate 10A and the device substrate 10B.

The composition of an adhesive agent configuring the adhesive layer 11 is not particularly limited, and any kind of adhesive agent can be used. However, it is preferable to use an adhesive agent using a thermosetting resin as the main component. Since such an adhesive agent has comparatively high thermal resistance and chemical resistance, the adhesive layer 11 that is not easily deteriorated during plating treatment can be formed. Specifically, an epoxy-based adhesive agent, a urethane-based adhesive agent, a silicone-based adhesive agent, an olefin-based adhesive agent, and the like may be included.

The nozzle substrate 21 is bonded to the lower surface of the device substrate 10B. Also, though it is not illustrated in FIG. 5C, the compliance substrate 26 and the like are formed. As described above, the base substrate 2 as illustrated in FIG. 5C can be obtained.

In addition, if the sealing plate 10A is bonded to the upper surface of the device substrate 10B, the gap 294 having a length corresponding to the thickness of the adhesive layer 11 is generated between the conductive portion 291 included in the device substrate 10B and the conductive portion 293 included in the sealing plate 10A. The length of the gap 294 (length in vertical direction of FIGS. 5A to 5C) differs according to the thickness of the adhesive layer 11 and the pattern of the conductive portion 293, but the length is set to be preferably in the range of 0.1 µm and to 5 µm, and set to be more preferably in the range of 0.5 µm to 2 µm. If the gap 294 has the length above, it is possible to sufficiently fill the gap 294 with the plating layer 282 described below, and it is possible to obtain the highly reliable wiring 280.

Subsequently, as illustrated in FIG. 6A, the IC 9 is prepared. The IC 9 has a substrate shape, and includes a terminal 93 provided on the upper surface 92. Also, the end surface 94a has an inclined surface as described above.

Subsequently, as illustrated in FIG. 6B, the conductive portion 292 and the conductive portion 292' are formed. For example, after a metallic film is formed on the entire IC 9, the conductive portions 292 and 292' are formed by patterning the metallic film. Hereinafter, the description of the method will be described in detail.

The metallic film is formed through various film forming methods such as a vacuum evaporation method, a sputtering method, a CVD method, a plating method, and the like. Among these, the sputtering method is preferably used. According to the sputtering method, since it is possible to form a metallic film having high adhesive properties at a comparatively low temperature, the heat effect on the base substrate 2 followed by the film formation can be suppressed to the minimum, and can contribute to the realization of the droplet ejecting head 1 with high accuracy. Also, since the control of the film thickness is comparatively easy, it is possible to obtain the metallic film which is highly uniform in thickness. Finally, it is possible to enhance the accuracy in patterning the conductive portions 292 and 292' (the conductive portion 281), and to contribute to the formation of highly dense wiring 280. Also, the metallic film is provided to form the conductive portions 292 and 292', and may have a single layer or multiple layers as described above.

Subsequently, the resist is formed on the obtained metallic film. Then, the resist is patterned by a photolithography (exposure or developing) method.

Subsequently, an etching treatment is performed on the metallic film. In the case of wet etching, iodine-based etchant, nitric acid-based etchant, hydrochloric acid-based etchant, and hydrogen peroxide-based etchant are preferably used as the etchant.

Subsequently, the resist is separated. Accordingly, the metallic film is patterned, so that the conductive portions 292 and 292' illustrated in FIG. 6B are obtained. Also, the conductive portion 281 including the conductive portion 291, the conductive portion 292, and the conductive portion 293 which are separated from each other can be obtained.

Then, the IC 9 in which the conductive portions 292 and 292' are formed is bonded to the upper surface of a base substrate 2 as illustrated in FIG. 6C. The bonding is performed by using the adhesive layer 14. However, at this point, the arrangement of the IC 9 is adjusted so that the first side wall portion 272a of the concave portion 27 and the end surface 94a of the IC 9 are positioned on the same surface. In the same manner, the position of the IC 9 is adjusted so that the first side wall portion 272b of the concave portion 27 and the end surface 94b of the IC 9 are positioned on the same surface.

The composition of the adhesive agent that configures the adhesive layer 14 is not particularly limited, and is the same as the composition of the adhesive agent that configures the adhesive layer 11 described above.

In addition, if the IC 9 is bonded to the upper surface of the base substrate 2, the gap 295 that has a length corresponding to the thickness of the adhesive layer 14 is generated between the conductive portion 293 included in the base substrate 2 and the conductive portion 292 provided on the IC 9. The length of the gap 295 (length in vertical direction of FIGS. 6A to 6C) differs according to the thickness of the adhesive layer 14 and the patterns of the conductive portion 292 and the conductive portion 293, but the length is set to be preferably in the range of 0.1 µm to 5 µm, and is set to be more preferably in the range of 0.5 µm to 2 µm. If the gap 295 has the length above, it is possible to sufficiently fill the gap 295 with the plating layer 282 described below, and it is possible to obtain the highly reliable wiring 280.

In the steps described below, in view of forming the plating layer 282, it is preferable that an end portion on the concave portion 27 side among end portions of the adhesive layer 11 in FIGS. 5A to 5C be matched with the lower end portion of the reservoir forming substrate 24, or slightly recessed to the opposite side to the concave portion 27 from the lower end portion of the reservoir forming substrate 24. When the plating layer 282 is deposited, the interruption of the plating layer 282 caused by the intervention of the adhesive layer 11 is suppressed. Therefore, it is possible to enhance the reliability of the wiring 280.

Also, in the same manner, it is preferable that an end portion on the concave portion 27 side among the end portions of the adhesive layer 14 in FIGS. 6A to 6C be matched with the lower end portion of the IC 9, or slightly recessed to the opposite side to the concave portion 27 from the lower end portion of the IC 9. When the plating layer 282 is deposited, the interruption of the plating layer 282 caused by the intervention of the adhesive layer 14 is suppressed so that it becomes difficult for the metallic film between the IC 9 and the sealing plate 10A to interrupt. Therefore, it is possible to enhance the reliability of the wiring 280.

When the adhesive layers 11 and 14 are recessed, the recess amounts are not particularly limited, but the recess amounts are set to be preferably in the range of 0.1 µm to 5 µm, and are set to be more preferably in the range of 0.5 µm to 2 μm. If the recess amounts of the adhesive layers 11 and 14 are set within the range described above, the widths of the gaps 294 and 295 described above (lengths in the horizontal direction of FIGS. 5A to 6C) are secured to an extent. As a result, in the steps described below, the adhesion of the plating layer 282 increases by causing the plating layer 282 to enter the gaps 294 and 295, and thus it is possible to further enhance the reliability of the droplet ejecting head 1.

[2] The plating metal M is deposited on the conductive portion 281 as illustrated in FIG. 7A by the plating method. In the same manner, the plating metal M is deposited on the conductive portion 292' and the conductive layer 246. Accordingly, the wiring 280 and 280' (wiring patterns 28 and 28') illustrated in FIG. 7B are formed.

It is preferable that the plating method may be an electrolytic plating method, but an electroless plating method may be preferably used. According to the electroless plating method, the plating metal M is selectively deposited on the conductive portion 281 and the like as indicated by an arrow in FIG. 7A, and the plating layers 282 and 282' can be easily formed. Further, inserting an electrode therein is not necessary. Also, even if the concave portion 27 exists, if plating solution is permeated, the plating can be performed therein. Therefore, the electroless plating method can be appropriately applied particularly to the form of the droplet ejecting head 1.

Here, in the plating method, the plating metal M is isotropically deposited and grows on the conductive portion 281. As the plating metal M gradually grows on the conductive portion 291, the conductive portion 292, and the conductive portion 293 which are separate from each other, the gaps 294 and 295 are gradually narrowed. Finally, the gaps 294 and 295 are filled with the plating metal M so that electrical connections between the conductive portion 291 and the conductive portion 293, and between the conductive portion 292 and the conductive portion 293 can be formed.

In the case of the plating method, since the plating metal M is isotropically deposited on the conductive portion 281, the plating layer 282 grows not only in the thickness direction of the conductive portion 281 but also in the width direction. At this point, if the separation distance between the adjacent conductive portions 281 is small, a short circuit may occur. On the contrary, according to the first embodiment, the conductive portion 281 is formed by patterning the metallic film as described above, and then the plating layer 282 is formed mainly for the purpose of forming the electrical connection by filling the gaps 294 and 295. Therefore, the thickness of the plating layer 282 is sufficient if it is the thickness in which the gaps 294 and 295 can be filled with the plating layer 282, and it does not have to be unnecessarily thick. Accordingly, even if the separation distance between the adjacent conductive portions 281 is small, it is possible to form the plating layer 282. As a result, it is possible to cause the wiring 280 to be disposed at high density, and to have low electrical resistance at the same time.

Also, according to the first embodiment, the conductive portion 292 is formed on the IC 9, the conductive portion 293 is formed on the sealing plate 10A, and the conductive portion 291 is formed on the device substrate 10B in advance. Then, after the bonding of the IC 9, the sealing plate 10A, and the device substrate 10B, the plating layer 282 is formed. Therefore, it is possible to easily cause the separation distance between the conductive portion 291 and the conductive portion 293, and the separation distance between the conductive portion 292 and the conductive portion 293 to be sufficiently reduced by appropriately designing pattern shapes of the conductive portion 291, the conductive portion 292, and the conductive portion 293, and accordingly, it is possible to easily set the lengths of the gaps 294 and 295 to be extremely short as described above.

In addition, according to the first embodiment, after the conductive portion 281 is formed by patterning the metallic film, the plating layer 282 is deposited thereon. Therefore, it is possible to cause the fineness of the obtained wiring 280 to be almost the same as the fineness of the conductive portion 281. Accordingly, since it is possible to obtain the highly fine conductive portion 281 by forming the conductive portion 281, for example, by the photolithographic method, it is possible to obtain the highly fine wiring 280 as a result. According to the same principle, it is possible to cause the wiring 280 to be disposed at high density and to reduce the size of the droplet ejecting head 1.

The droplet ejecting head 1 obtained as described above has an advantage in that it is possible to easily reduce the size thereof by causing the wiring 280 to be disposed at high density and it is possible to easily obtain the enhancement of the operation performance (for example, speed improvement) and the improvement of reliability by causing the wiring 280 to have low electrical resistance.

In addition, the first embodiment is an example in which one reservoir forming substrate 24 is formed with one sheet of base material, but the invention is not limited thereto. However, one droplet ejecting head 1 may be manufactured by forming a plurality of reservoir forming substrates 24 with one sheet of base material and then performing the separating operation.

Printing Apparatus

The printing apparatus 100 including the droplet ejecting head 1 is described.

The printing apparatus 100 illustrated in FIG. 8 is a printing apparatus performing printing on the recording medium 200 by an ink jet method. The printing apparatus 100 includes an apparatus main body 50, recording head units 20A and 20B on which the droplet ejecting head 1 is mounted, ink cartridges 30A and 30B that supply the ink 300, a carriage 40 that transports the recording head units 20A and 20B, a moving mechanism 70 that moves the carriage 40, and the carriage shaft 60 that movably supports (guides) the carriage 40.

The ink cartridge 30A can be detachably mounted on the recording head unit 20A and supply the ink 300 (black ink composition) to the recording head unit 20A in the mounted state.

The ink cartridge 30B can be also detachably mounted on the recording head unit 20B, and supply the ink 300 (color ink composition) to the recording head unit 20B in the mounted state.

The moving mechanism 70 includes a driving motor 701, and a timing belt 702 coupled to the driving motor 701. Also, it is possible to move the carriage 40 in the direction of the carriage shaft 60 together with the recording head units 20A and 20B by transporting the driving force of the driving motor 701 (torque) to the carriage 40 via the timing belt 702.

A platen 80 is provided in the apparatus main body 50 to the lower side of the carriage shaft 60 in the axial direction. The recording medium 200 fed by a feeding roller (not illustrated) or the like is transported to the platen 80. Then, printing is performed by ejecting the ink 300 onto the recording medium 200 on the platen 80.

According to the embodiment of the invention, since it is possible to achieve the reduction of the size of the droplet ejecting head 1, and the improvement of the reliability, it is possible to achieve the reduction of the size and the improvement of the reliability of the printing apparatus 100.

Second Embodiment

Figure 9:
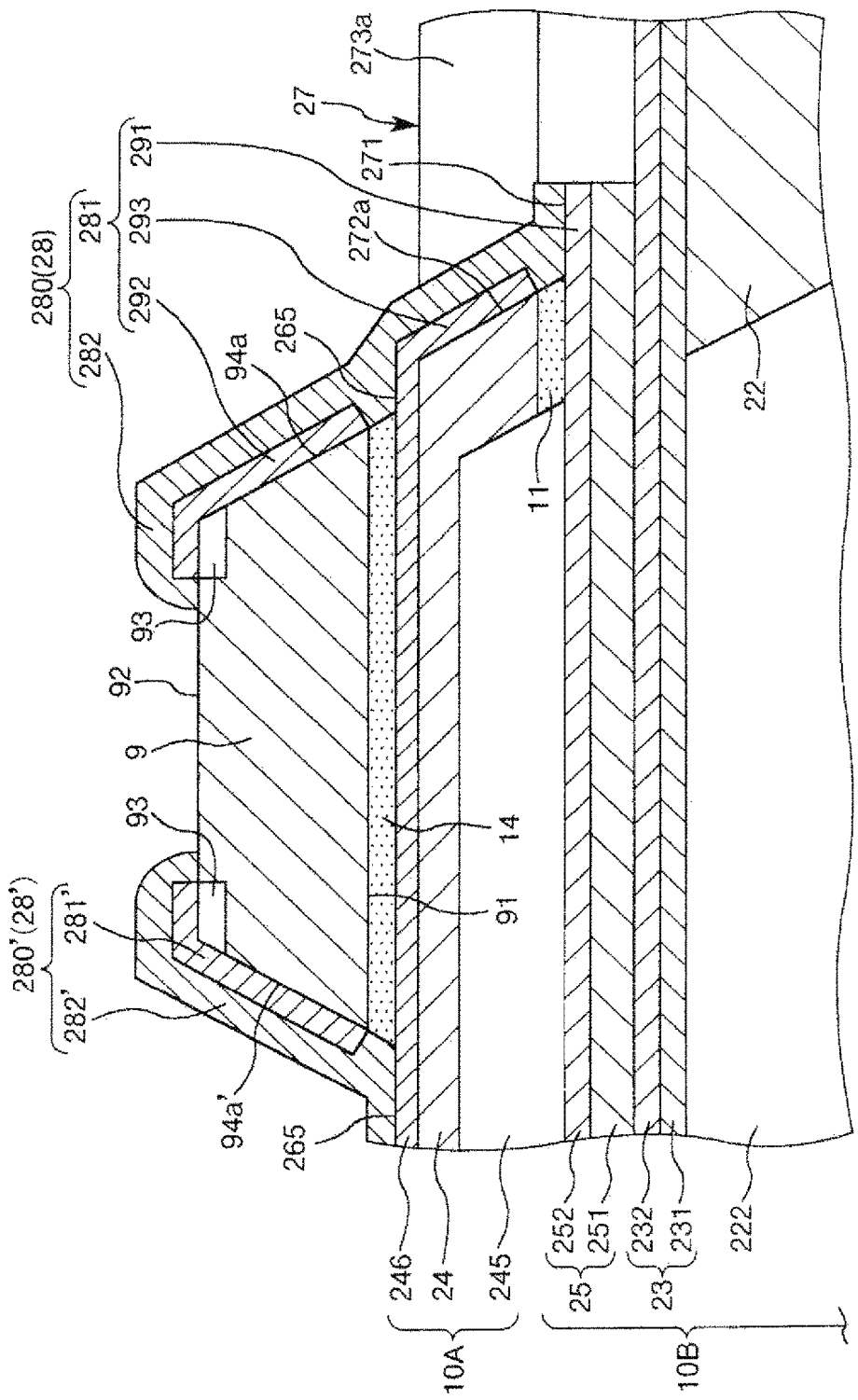
FIG. 9 is an enlarged cross-sectional view illustrating a part of a droplet ejecting head to which a conduction structure according to a second embodiment of the invention is applied (droplet ejecting head according to second embodiment of the invention).

FIG. 9 is an enlarged cross-sectional view illustrating a part of a droplet ejecting head to which the conduction structure according to the second embodiment of the invention is applied (droplet ejecting head according to second embodiment of the invention). Hereinafter, for convenience of the description, upper sides of FIG. 9 are referred to as "up" or "upper", and lower sides thereof are referred to as "under" or "lower".

Hereinafter, the second embodiment is described, but difference from the embodiment described above is mainly described below, and the same matters are omitted in the description.

The droplet ejecting head 1 according to the second embodiment is the same as the droplet ejecting head 1 according to the first embodiment except that the end surface 94a of the IC 9, the first side wall portion 272a of the concave portion are deviated from each other. Also, in FIG. 9, configurations which are the same as those in the first embodiment described above are denoted by the same reference numerals.

The IC 9 illustrated in FIG. 9 is arranged so that the end surface 94a thereof is deviated from an extended line of the first side wall portion 272a of the concave portion 27 to the left side of FIG. 9 (on the opposite side to the concave portion 27). As a result of the arrangement described above, a step is formed between the end surface 94a and the first side wall portion 272a. In FIG. 9, the upper surface 265 of the sealing plate 10A is exposed between the end surface 94a and the first side wall portion 272a, and this becomes the step.

The plating layer 282 is also deposited on the step, and the contact area of the plating layer 282 and the conductive layer 246 is increased by providing the step. Accordingly, it is possible to reduce the contact resistance between the plating layer 282 and the conductive layer 246, and it is possible to further enhance the reliability of the electrical connection between the plating layer 282 and the conductive layer 246. Specifically, if the conductive layer 246 is patterned, and the electronic circuit is formed, it is advantageous in view of the operation stability of the electronic circuit.

The deviation amount between the end surface 94a and the first side wall portion 272a is appropriately set according to the size of the droplet ejecting head 1, and is not particularly limited. However, for example, the deviation amount is preferably in the range of approximately 50 µm 2000 µm, and more preferably in the range of approximately 100 µm to 1000 µm. It is possible to suppress the increase of the size of the conduction structure and cause the contact resistance of the plating layer 282 and the conductive layer 246 to be sufficiently small by setting the deviation amount in the range described above.

In addition, according to the second embodiment, it is also possible to obtain the effects and the results which are the same as in the first embodiment described above.

Third Embodiment

Figure 10:
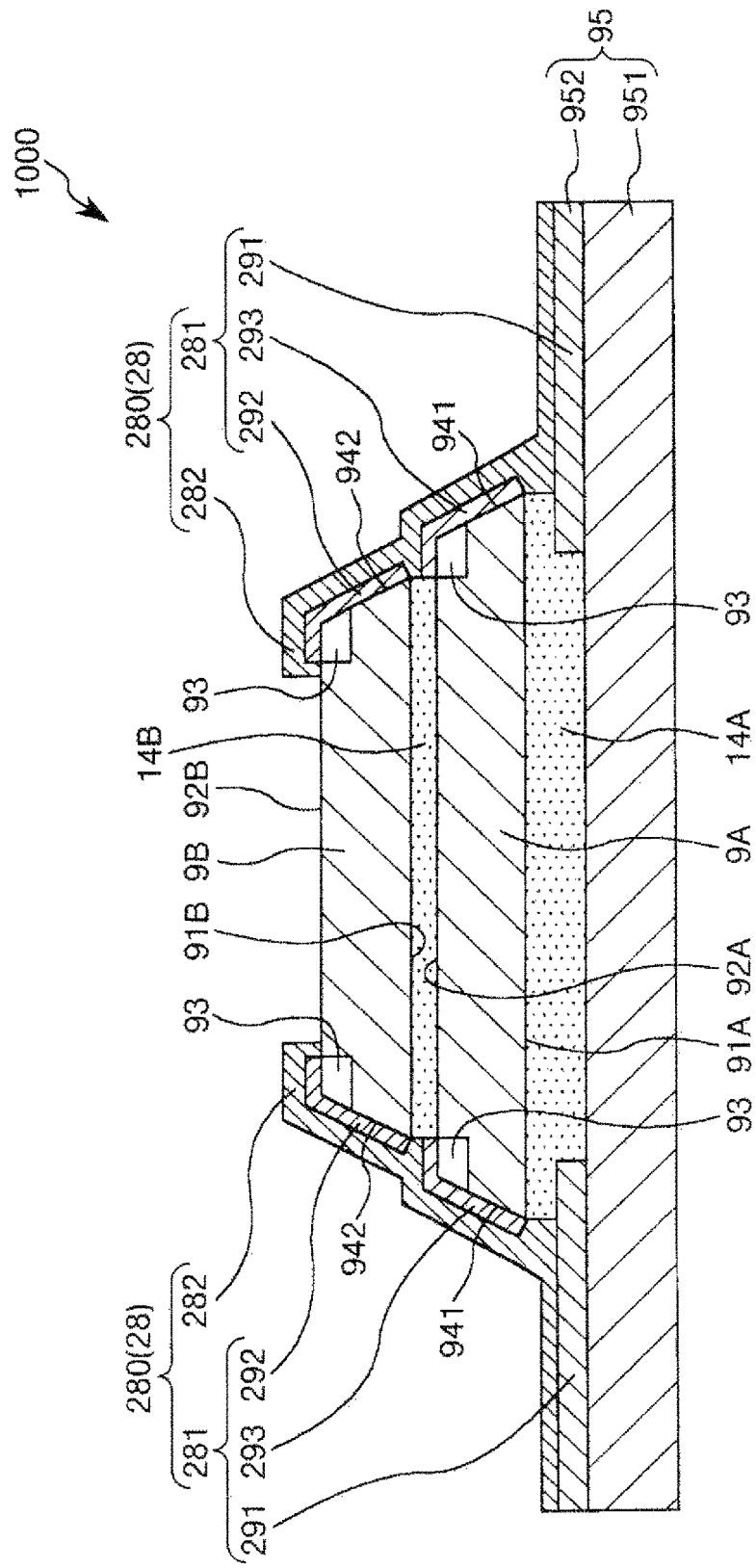
FIG. 10 is an enlarged cross-sectional view illustrating a part of a droplet ejecting head to which a conduction structure according to a third embodiment of the invention is applied.

FIG. 10 is an enlarged cross-sectional view illustrating a part of a semiconductor apparatus to which the conduction structure according to a third embodiment of the invention is applied. Hereinafter, for convenience of description, upper sides of FIG. 10 are referred to as "up" or "upper", and lower sides thereof are referred to as "under" or "lower".

Hereinafter, the third embodiment is described, but differences from the embodiments described above are mainly described below, and the same matters are omitted in the description. Also, in FIG. 10, configurations which are the same as those in the first and second embodiments described above are denoted by the same reference numerals.

A semiconductor apparatus 1000 having the conduction structure according to the third embodiment includes a semiconductor package substrate 95, a first semiconductor chip 9A mounted thereon, and a second semiconductor chip 9B further stacked thereon. The semiconductor apparatus 1000 is operated as a stacking-type semiconductor device by connecting a terminal (not illustrated) provided on the lower surface of the package substrate 95 to the electric circuit. In addition, the package substrate 95, the first semiconductor chip 9A, and the second semiconductor chip 9B according to the third embodiment all have a plate shape that expands in the horizontal direction of FIG. 10. Therefore, in the description according to the third embodiment, among the two main surfaces included in each of the package substrate 95, the first semiconductor chip 9A, and the second semiconductor chip 9B, a main surface positioned on the upper side of FIG. 10 is referred to as an "upper surface", and the other main surface positioned on the lower side is referred to as a "lower surface".

The package substrate 95 includes an insulation substrate 951 and a conductive layer 952 provided thereon. As respective configuration materials of the insulation substrate 951 and the conductive layer 952, configuration materials used in the well-known package substrate are used.

The first semiconductor chip 9A is bonded to the upper surface of the package substrate 95 via an adhesive layer 14A. The first semiconductor chip 9A has the same configuration as the IC 9 according to the first embodiment.

In the first semiconductor chip 9A, a lower surface 91A and an upper surface 92A are parallel to each other, and the lower surface 91A is bonded to the upper surface of the package substrate 95 so as to be substantially parallel to each other.

Meanwhile, end surfaces 941 and 941 of the first semiconductor chip 9A are inclined respectively to the lower surface 91A and the upper surface 92A, and continue to the lower surface 91A and the upper surface 92A. The end surfaces 941 and 941 have the same configuration as the end surface 94a of the IC 9 according to the first embodiment.

Also, the first semiconductor chip 9A includes the terminals 93 provided to be exposed to the upper surface 92A thereof. It is possible to operate the first semiconductor chip 9A by connecting the terminals 93 to the package substrate 95.

The second semiconductor chip 9B is bonded to the upper surface of the first semiconductor chip 9A via the adhesive layer 14B. The second semiconductor chip 9B also has the same configuration as that of the IC 9 according to the first embodiment.

The configuration of the second semiconductor chip 9B is the same as that of the first semiconductor chip 9A except that sizes of a lower surface 91B and an upper surface 92B are respectively smaller than those in the first semiconductor chip 9A.

Meanwhile, end surfaces 942 and 942 of the second semiconductor chip 9B are inclined respectively to the lower surface 91B and the upper surface 92B, and are continued to the lower surface 91B and the upper surface 92B. The end surfaces 942 and 942 also have the same configuration as that of the end surface 94a of the IC 9 according to the first embodiment.

Also, the second semiconductor chip 9B includes the terminals 93 provided so as to be exposed to the upper surface 92B. It is possible to operate the second semiconductor chip 9B by connecting the terminals 93 to the package substrate 95.

Here, the first semiconductor chip 9A and the second semiconductor chip 9B are arranged so that the end surface 941 and the end surface 942 are deviated from each other in the same manner as in the second embodiment. Also, the semiconductor apparatus 1000 includes the conductive portion 281 and the plating layer 282 in the same manner as in the conduction structure according to the second embodiment. Specifically, the conductive portion 281 illustrated in FIG. 10 includes the conductive portion 292 provided from the upper surface 92B of the second semiconductor chip 9B to the end surface 942, the conductive portion 293 provided from the upper surface 92A of the first semiconductor chip 9A to the end surface 941, and the conductive portion 291 provided on the upper surface of the package substrate 95.

The wiring 280 including the conductive portion 281 and the plating layer 282 can be disposed at high density, and have low electrical resistance at the same time as in the respective embodiments described above. Accordingly, the semiconductor apparatus 1000 having the conduction structure including the wiring 280 (the wiring pattern 28) can easily be reduced in size and have high reliability.

In addition, according to the third embodiment, it is possible to achieve the effects and the results as described in the first and second embodiments described above.

In addition, the number of stacked layers of the semiconductor chip is not limited to 2, and may be 3 or more.

In addition, it is possible to obtain the small and highly reliable electronic apparatus by mounting the semiconductor apparatus 1000 on an electronic apparatus.

As the electronic apparatus, for example, a personal computer (mobile personal computer), a cellular phone, a digital still camera, a lap top personal computer, a television, a video camera, a video tape recorder, a car navigation apparatus, a pager, an electronic organizer (including one with a communication function), an electronic dictionary, a calculator, an electronic gaming apparatus, a word processor, a work station, a video phone, a security television monitor, electronic binocular, a POS terminal, medical equipment (for example, an electronic thermometer, a sphygmomanometer, a blood sugar meter, an electrocardiographic apparatus, an ultrasonic diagnosis apparatus, and an electronic endoscope), a fish finder, various measuring apparatuses, instruments (for example, instruments for vehicles, planes, and ships), and a flight simulator are included.

In the above, a conduction structure, a method of manufacturing a conduction structure, a droplet ejecting head, and a printing apparatus according to the invention are described with reference to the embodiments in the drawings. However, the invention is not limited thereto, and the respective units that configure the conduction structure, the droplet ejecting head, and the printing apparatus can be substituted with any configurations that can exhibit the same functions. In addition, certain configurations can also be considered.

In addition, in the first and second embodiments, the sealing plate is used as an example of the first substrate, the IC is used as an example of the second substrate, and the device substrate is used as an example of the third substrate. In addition, in the third embodiment, the semiconductor chips are used as examples of the first and second substrates, and the package substrate is used as an example of the third substrate. However, the invention is not limited to these, and the first to third substrates may be substrates respectively having certain functions. In the same manner, in the respective embodiments, the conductive portion 293 corresponds to the "first conductive portion", and the conductive portion 292 corresponds to the "second conductive portion", but the invention is not limited thereto.

In addition, the conduction structure, the method of manufacturing the conduction structure, the droplet ejecting head, and the printing apparatus according to the invention may be obtained by combining two or more arbitrary configurations (characteristics) according to the respective embodiments.

Also, the droplet ejecting head (printing apparatus) is configured to perform printing by ejecting ink as droplets onto a recording medium such as printing paper. The invention is not limited thereto, and for example, a liquid crystal display device can be manufactured by ejecting a liquid crystal display device forming material as droplets, an organic EL display device (organic EL apparatus) can be manufactured by ejecting the organic EL forming material as droplets, and a circuit substrate can be manufactured by ejecting a wiring pattern forming material as droplets and forming a wiring pattern of an electric circuit.

The entire disclosure of Japanese Patent Application No. 2014-23735, filed Feb. 10, 2014 is expressly incorporated by reference herein.

What is claimed is:

1. A conduction structure comprising:
    a first substrate that has a main surface, an end surface continued to the main surface in a non-parallel manner, and a first conductive portion provided on the end surface;
    a second substrate that has a main surface, an end surface continued to the main surface in a non-parallel manner, and a second conductive portion provided on the end surface, and that is provided so that the main surface thereof faces the main surface of the first substrate; and
    a plating layer that electrically connects between the first conductive portion and the second conductive portion,
    wherein, in the first substrate, an angle formed between the main surface and the end surface is greater than 0° and less than 90°, and
    wherein, in the second substrate, an angle formed between the main surface and the end surface is greater than 0° and less than 90°.

2. The conduction structure according to claim 1, wherein the second substrate is made of silicon as a main material.

3. The conduction structure according to claim 2, wherein the end surface of the second substrate is configured with a plane of (1, 1, 1) silicon surface orientation.

4. A droplet ejecting head comprising:
    the conduction structure according to claim 3.

5. A droplet ejecting head comprising:
    the conduction structure according to claim 2.

6. The conduction structure according to claim 1, wherein the end surface of the first substrate and the end surface of the second substrate are positioned on the same surface.

7. A droplet ejecting head comprising:
    the conduction structure according to claim 6.

8. The conduction structure according to claim 1, wherein the first substrate further includes an electric circuit connected to the first conductive portion.

9. A droplet ejecting head comprising:
the conduction structure according to claim 1.

10. A printing apparatus comprising:
the droplet ejecting head according to claim 9.

11. A conduction structure comprising:
- a first substrate that has a main surface, an end surface continued to the main surface in a non-parallel manner, and a first conductive portion provided on the end surface;
- a second substrate that has a main surface, an end surface continued to the main surface in a non-parallel manner, and a second conductive portion provided on the end surface, and that is provided so that the main surface thereof faces the main surface of the first substrate; and
- a plating layer that electrically connects between the first conductive portion and the second conductive portion, and
- wherein the end surface of the first substrate and the end surface of the second substrate are parallel and positioned in a deviated manner.

12. The conduction structure according to claim 11, wherein the second substrate is made of silicon as a main material.

13. The conduction structure according to claim 12, wherein the end surface of the second substrate is configured with a plane of (1, 1, 1) silicon surface orientation.

14. A droplet ejecting head comprising:
the conduction structure according to claim 13.

15. A droplet ejecting head comprising:
the conduction structure according to claim 12.

16. The conduction structure according to claim 11, wherein the end surface of the first substrate and the end surface of the second substrate are positioned on the same surface.

17. A droplet ejecting head comprising:
the conduction structure according to claim 16.

18. The conduction structure according to claim 11, wherein the first substrate further includes an electric circuit connected to the first conductive portion.

19. A droplet ejecting head comprising:
the conduction structure according to claim 11.

20. A printing apparatus comprising:
the droplet ejecting head according to claim 19.

\* \* \* \* \*